(12) United States Patent
Verjans et al.

(10) Patent No.: US 8,110,827 B2
(45) Date of Patent: Feb. 7, 2012

(54) LIGHT EMITTING DEVICE

(75) Inventors: Conrad Wilhelmus Adriaan Verjans, Landgraaf (NL); Dietrich Bertram, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 131 days.

(21) Appl. No.: 12/593,340

(22) PCT Filed: Mar. 31, 2008

(86) PCT No.: PCT/IB2008/051185
§ 371 (c)(1),
(2), (4) Date: Sep. 28, 2009

(87) PCT Pub. No.: WO2008/122907
PCT Pub. Date: Oct. 16, 2008

(65) Prior Publication Data
US 2010/0108998 A1 May 6, 2010

(30) Foreign Application Priority Data
Apr. 4, 2007 (EP) ...................................... 07105632

(51) Int. Cl.
*H01L 51/50* (2006.01)

(52) U.S. Cl. .................................. 257/40; 257/E51.018
(58) Field of Classification Search ................... 257/40, 257/E51.018
See application file for complete search history.

(56) References Cited

U.S. PATENT DOCUMENTS

| | | | |
|---|---|---|---|
| 2004/0207320 A1* | 10/2004 | Erchak | 313/506 |
| 2005/0231101 A1* | 10/2005 | Chen | 313/504 |
| 2005/0259198 A1 | 11/2005 | Lubart et al. | |
| 2006/0216474 A1* | 9/2006 | Keller | 428/141 |
| 2007/0241326 A1* | 10/2007 | Kim et al. | 257/40 |

FOREIGN PATENT DOCUMENTS

| | | |
|---|---|---|
| EP | 1403908 A2 | 3/2004 |
| WO | 0223644 A1 | 3/2002 |

\* cited by examiner

*Primary Examiner* — Colleen Matthews

(57) ABSTRACT

A light emitting device includes a stack of layers of a substrate, with a basic layer, first and second electrode layers, and an organic light-emitting layer which is sandwiched between the first and the second electrode layers. At least a part of the basic layer is covered by a shielding structure that includes a plurality of lamella elements that extend sheet-like from the stack of layers in such a way, that the lamella elements guide light out of the light emitting device.

13 Claims, 5 Drawing Sheets

US 8,110,827 B2

LIGHT EMITTING DEVICE

FIELD OF THE INVENTION

This invention relates to a light emitting device comprising a stack of layers of a substrate, with a basic layer, a first electrode layer and a second electrode layer, wherein an organic light-emitting layer is sandwiched between the first and the second electrode layer, the organic light-emitting layer is emitting an artificial light.

BACKGROUND OF THE INVENTION

To generate a favorable climate in a room large area illumination devices are needed. Nowadays often gas discharge lamps are used to generate a homogeneous light, illuminating large parts of the room. Unfortunately, discharge lamps are known to be costly and quite inefficient. To overcome this disadvantage, the use of organic light emitting diodes (OLED) is appropriate. The advantage of the OLED is that it is a homogeneous light source with potentially low costs and high efficiency. Organic light emitting devices (materials and structures) are known in the art, for instant as disclosed in WO2005/053053 A1, the disclosure of which is incorporated herein by reference for all purposes.

However, OLEDs possess a lamberic characteristic so that the light is evenly spread in all directions. This has the disadvantage that OLEDs, being used as large area illumination devices will glare. As OLEDs nowadays reach high light fluxes, the emitted artificial light will blind the eyes of a person, entering a room, being illuminated by an OLED.

In the US 2005/0259198 A1 a collimating device and a transflector for use in a system having a backlight is disclosed. The collimating device has a cone like cross-section and is embedded in an optical element layer covering the substrate of an OLED. The aim of this optical element layer is to reduce the given angular distribution of the light and to increase the peak intensity. However, the shown microscopic structure will not prevent glare, if the OLED is used as a large area illumination device.

SUMMARY OF THE INVENTION

The invention has for its object to eliminate the above mentioned disadvantages. In particular it is an object to the invention to provide an OLED, which is able to illuminate large areas without glaring.

To achieve the object of the invention, at least a part of the basic layer is covered by a shielding structure, wherein the shielding structure comprises a plurality of lamella elements, the lamella elements extend sheet like from the stack of layers in such a way, that the lamella elements guide the artificial light out of the light emitting device.

The leading thought of the invention is to use macroscopic lamella elements to border and to guide the ambient light, emitted by the OLED. Thus, the light flux of the OLED is channelized to illuminate a spot or an area. Furthermore, due to the macroscopic size of the shielding structure a person looking at the illumination device won't have a direct line of view on the light-emitting layer. Therefore, the lamella elements will prevent the artificial light from glaring the person.

The origin of the described light emitting device is an OLED. This homogenous large area light source comprises at least three layers for generating the artificial light. Furthermore, the OLED may comprises a substrate layer which serves as a carrier and may be made of glass or organic material or from non transmittive material such as metal foils. Onto this substrate usually a thin layer of a transparent Indium Tin Oxide (ITO) is applied, forming the first electrode layer. Furthermore, organic light emitting diodes consists of at least one thin layer, with a layer thickness of approximately 5 to 500 nm of organic substances. The OLED is regularly covered with a layer of metal, like aluminum, forming the second electrode layer, whereas the metal layer features a thickness of approximately 100 nm and thus a thickness like the ITO-layer. Aluminum of such a thickness works as a mirror, such that the emission is through the transparent ITO first electrode layer and the transparent substrate only. In the context of the invention, the term organic light-emitting layer comprises a single layer of an organic material as well as an element, build of several layers, comprising organic and inorganic material.

In the context of the invention, the term "basic layer" should not be confused with the term "substrate" often used in the description for OLEDs as the layer on which the electrode and/or organic layers are deposited. The basic layer in the sense of the invention may but must not be the substrate. For example, if a bottom emitting OLED is used, where the artificial light leaves the organic light-emitting layer through the substrate, basic layer and substrate are to be the same. In a case where a top emitting OLED is used, the basic layer may also be the coating sheet on top of one of the electrode layers. In both cases the basic layer is always the outer layer of the OLED through which the artificial light, generated in the organic light-emitting layer will leave the OLED.

In a preferred embodiment the shielding structure is connected to the basic layer. This arrangement accomplishes two aims. On the one hand the artificial light is guided by the lamella elements so that no glare will appear. On the other hand the shielding structure will work like a cooling web, dissipating the heat from the OLED. To achieve the second aim, a mechanical contact between the OLED and the shielding structure has to be established. The connection may be done through different methods achieving a thermal contact between the shielding structure and the basic layer, wherein the connection comprises a high thermal conductivity. For example this connection can be achieved by gluing or welding the shielding structure to the basic layer. Especially, laser welding, resistant welding or electron beam welding have shown to be advantageous. Apart from this merging, the shielding structure can be produced by thin film deposition techniques, such as ion beam depositing, electron beam depositing, chemical vapor depositing and galvanic depositing.

In another embodiment, the shielding structure and the basic layer are one-piece. This embodiment has the advantage, that there are no crossing points between the basic layer and the shielding structure, hindering the flow of heat. As the basic layer has to be light transparent, it may be made of glass. The shielding structure may be milled out of this glass layer. If a polymeric material is used for the basic layer, the one-piece shielding structure/basic layer can be made during the casting. This type of production is cheap and preferably in those cases, where large numbers of the light emitting devices are produced. After the casting, the lamella elements of the shielding structure may be coated with a metallic surface to achieve the needed reflection of the artificial light.

In another embodiment the shielding structure comprises a mounting mean and the lamella elements are connected to the mounting mean. The mounting mean may be a frame like structure and the connection may either be achieved by screws, clips or plugs. All those named connection means enable a removable connection between the lamella element and the mounting mean. This would enable a user to replace a damaged lamella element without changing the whole shielding structure. Furthermore, the position of the lamella element could be changed, depending on the use of the light emitting device.

If the light emitting device is used as a ceiling light, covering a large part of a ceiling, it may be appropriate due to design reasons that each lamella element that is running over the whole length of the room is made of one piece. As the size for OLEDs produced today is in the range of 50×50 cm, in another preferred embodiment the mounting mean has a frame like support structure, in which the tile like OLEDs are embedded. By the use of this type of mounting mean an easy exchange of single OLEDs is possible. Furthermore, the mounting mean and/or shielding structure may possess a plurality of connectors to which the OLEDs are attached. All connectors could then be connected to a single driver and source for electrical power. This would simplify the electrical connection of all OLEDs to one power source.

The function of the lamella elements is to guide the artificial light out of the light emitting device so that glare is prevented. To achieve this aim, the lamella elements possess a sheet-like structure, being longer than high with a small width. Last named width is important, because the lamella elements shade the artificial light, being emitted by the organic light-emitting layer. Depending on the type of use, different dimensions of the lamella elements have shown to be advantageous. So the lamella element may comprise a height between 0.5 mm and 50 mm, preferably between 10 mm and 30 mm. Lamella elements with a height of 20 mm and 50 mm have shown to be advantages, if they are installed parallel to the side walls of a room. Thus, so a person looking inclined at the light emitting device, installed under the ceiling won't have a direct line of view to the light-emitting layer. Therefore, the object of the invention is achieved. If on the other hand the light emitting device is used as a spot light—e.g. for illuminating a desk—lamella elements comprising a height between 10 mm and 30 mm have shown to be advantageous. A further reduction of the height of the lamella elements from 0.5 mm and 10 mm is appropriate, if the distance between two lamella elements is also reduced. Thus, a micro grid covering the basic layer is established so that no glare occurs. The width of the lamella element—measured at the connection point to the basic layer—may be between 0.5 mm and 10 mm, preferably to 1 mm and 5 mm. As it has been mentioned before, the lamella element shades parts of the organic light-emitting layer. Therefore, on the one hand a small base area is appropriate, but on the other hand a sufficient mechanical stability has to be established. As measurements have shown, widths in the range as mentioned above have shown to be advantageous.

The length of the lamella elements may vary, depending on the type of use. Most commonly, the length of a lamella element will be between 5 cm and 200 cm, more preferably between 10 cm and 100 cm, most preferably between 20 and 50 cm. Lamella elements in this size are easy to produce and possess the needed mechanical stability.

The base area of the lamella may be reflective, either coated with a reflective material or made of a reflecting material (e.g. metal) to reflect back the OLED light in order to be outcoupled through a adjacent transparent area of the OLED.

The lamella elements work as a kind of a light guide, reflecting the light rays hitting the surface of the lamella element. Due to this reason, the outer form of the lamella element is crucial for the guiding of the artificial light. If an area of the light emitting device, bordered by the lamella elements should work as a spot light, the cross-section of the lamella elements have to differ from those lamella elements, which are used when the light emitting device is used for area illumination. Thus, in another preferred embodiment the lamella elements possess at least one of the following cross-sections: triangular, rectangular, parallelogram, arced, undulated, polygonal or trapezoidal. As tests have shown, lamella elements with rectangular cross-sections are easy to build and to install in the mounting mean. In the contrast, lamella elements with an arced or polygonal cross-section are good for focusing the artificial light, because the angle of reflection changes with the height of the lamella element.

In another preferred embodiment each lamella element possesses a planar or an undulated surface. If a spectral reflection is needed, the surface of the lamella element should be planar so that the wave propagation of the light ray is only depending on the angle of incident, at which the light ray is striking the surface of the lamella element. Therefore, a planar surface is mainly used for light emitting devices forming a spot light. To reduce the focusing of the artificial light by the lamella elements, also undulated surfaces can be used. In this case the reflection of the light striking the rough or granular surface is diffuse. This type of surface is especially advantageous in those cases, where the light emitting device is used as a wall washer, illuminating a whole wall of a room.

As it has been mentioned the lamella elements can be used for heat transportation. Therefore, the lamella elements should possess a good thermal conductivity. Preferred materials for the lamella elements are copper, aluminum, tin, steel or stainless steel. In any case, the lamella elements should possess a thermal conductivity larger than 50 W/(mK), more preferably larger than 100 W(m K). Also metals and transition metals such as silver, tungsten, molybdenum, chromium and the like are suitable. That applies also for combinations and alloys of these metals. If the heat of the light emitting device is dissipated by other means, the lamella element may also be made of a polymer. That kind of material has the advantage of being light weight, cheap and easy to produce. Therefore, polymeric lamella elements are preferably in all those cases where the weight of the shielding structure is important. To achieve the needed reflection and guiding of the light, the polymeric shielding structure may be covered with a metallic surface, creating a reflective surface.

If the light emitting device is mounted onto the ceiling of a room, the lamella elements may be arranged in a uniform manner to produce an even illumination. Therefore, it may be appropriate to position the lamella elements in parallel lines covering the basic layer. In another preferred embodiment the lamella elements are arranged on the basic layer in at least one of the following manners: triangular, foursquare, pentagonal, or octagonal. Each of this arrangement has its own advantages in light guiding. Also corners, curves or other structures of the room may force the installation of lamella elements in one of the named ways. As measurements have shown it is advantageous, if the lamella elements are arranged on the basic layer in a hexagonal manner, so that the lamella elements form a honeycomb structure. Because by using a honeycomb structure the artificial light can be directed more consequent. Since the OLED spreads the artificial light in all directions, the honeycomb structure will more acute direct the light and prevent glare in all directions. By giving lamella elements of the honeycomb structure the triangular shape, the artificial light will be reflected in a very efficient way.

In another preferred embodiment the lamella elements are arranged in a specific angle with respect to the basic layer, so that the light is guided into a certain direction. In this embodiment the angle of each lamella element depends on the position of the object to be illuminated and the position of the illumination device. Good combinations between light intensity, reduced glare and distance to the illuminated objects lead to an angle between 20° to 70°, more preferred between 30° and 60°, most preferred between 40° and 50°. Especially, the last named interval guarantees an illumination of an object within eye height combined with the needed distance of the light emitting device from the wall if the light emitting device is mounted underneath the ceiling.

In another preferred embodiment there may be a gradual change of the angle of the lamella elements with respect to their position on the light emitting device. If for example the light emitting device covers a ceiling of a wall it may be appropriate that the lamella elements positioned near the outer boundary of the ceiling possess a different angle than those lamella elements positioned above the desk or in the middle of the room. So, on the one side the shielding structure may be tuned to form a spot light, illuminating the desk, whereas other lamella elements are arranged to illuminate a whole wall.

The aforementioned light emitting device, as well as claimed components and the components to be used in accordance with the invention in the described embodiments, are not subject to any special exceptions with respect to size, shape, material selection. Technical concepts known in the pertinent field can be applied without limitations. Additional details, characteristics and advantages of the object of the present invention are disclosed in the subclaims and the following description of the respective figures—which are an exemplary fashion only—showing preferred embodiments of the light emitting device according to the present invention.

Theses figures are:

DETAILED DESCRIPTION OF EMBODIMENTS

Figure 1:
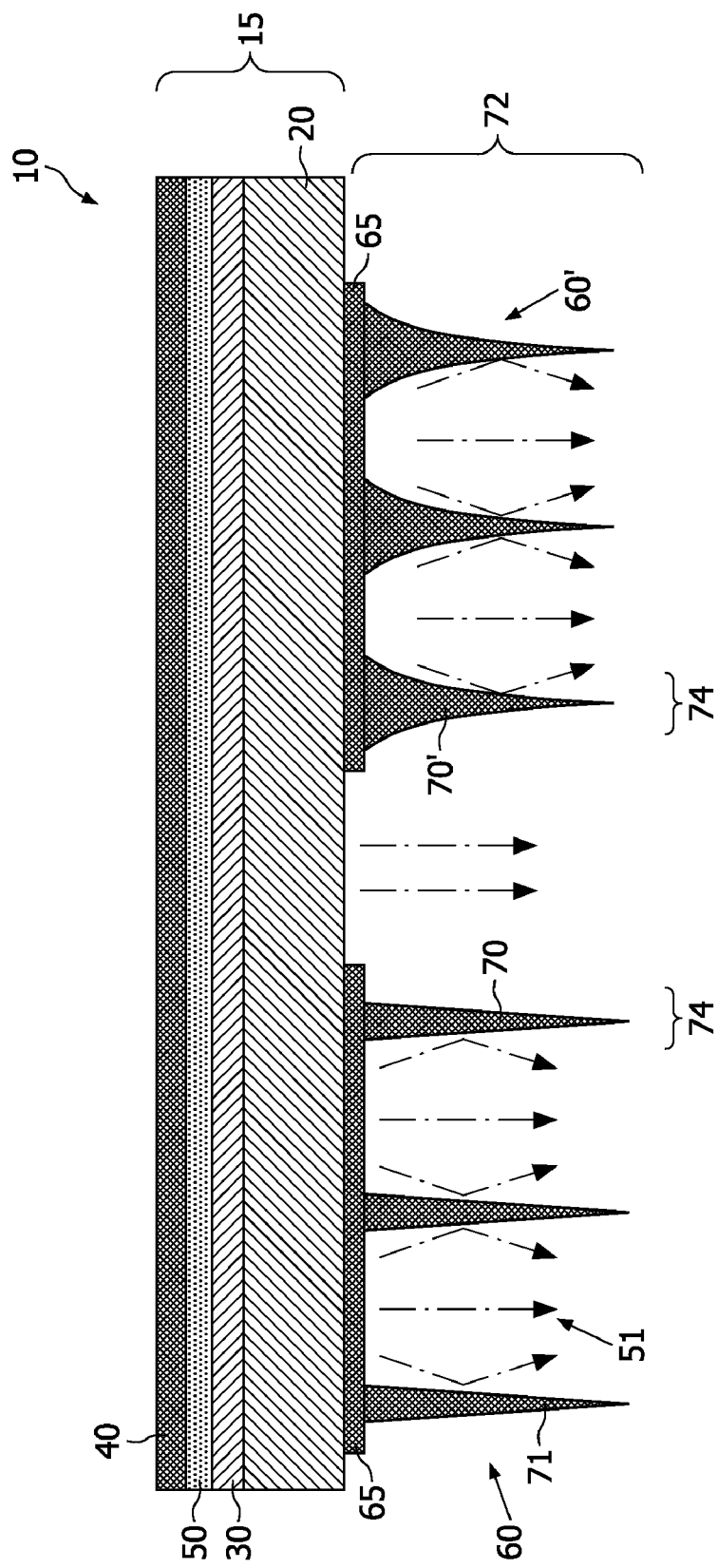
FIG. 1 shows a cross-section through a light emitting device.

In FIG. 1 a cross-section of a light emitting device 10 is shown. The light emitting device 10 comprises a stack of layers 15 of a substrate. In the shown embodiment the fundament of the light emitting device 10 is built by a basic layer 20, being a glass or a polymer substrate. Deposited onto this basic layer 20 is a first electrode layer 30. Above this first electrode layer an organic light-emitting layer 50 and a second electrode layer 40 are superimposed onto one another. Except the basic layer 20, each of the three named layers 30, 40, 50 comprise a size of less than 500 nm, preferably between 50 nm to 200 nm. If an electrical current is applied, flowing from the second electrode layer 40 to the first electrode layer 30, the organic light-emitting layer 50 emits an artificial light 51 by recombination of electrons and holes in the organic material. In the shown embodiment the second electrode layer 40 is made of aluminum that works as a kind of a mirror. So the artificial light 51 is only radiated through the transparent first electrode layer 30 and the basic layer 20.

The stack of layers 15 shown in FIG. 1 forms a bottom emitting OLED. Such kind of light emitting devices 10 can be produced in large sizes as to be installed underneath a ceiling of a room, which has to be illuminated. As OLEDs have a lamberic characteristic the light 51 is evenly spread in all directions. This, in combination with the high intensity of the emitted artificial light 51 will generate glare. To prevent this glare the shown light emitting device 10 comprises a shielding structure 60. The shielding structure 60 covers at least parts of the basic layer 20 and comprises a plurality of lamella elements 70. The lamella elements 70 extend sheet like from the stack of layers 15 in such a way, that the lamella elements 70 guide the artificial light 51 out of the light emitting device 10.

The light emitting device 10 shown in FIG. 1 possesses two different types of shielding structures 60, 60'. Each of the shielding structures 60, 60' covers a part of basic layer 20. The shielding structure 60 possesses three lamella elements 70, jutting out of the stack of layers 15 and guiding the artificial light 51. The artificial light 51 leaves the stack of layers 15 through the basic layer 20. The lamella elements 70 function as a kind of a mirror bordering a light guide. If parts of the artificial light 51 hit the surface 71 of the lamella elements 70, they will be reflected and thereby focused. Furthermore, a person who will look at the light emitting device 10 from a sidewise position will have no direct line of view to the light-emitting layer 50. So the disclosed shielding element 60 prevents glare.

In the shown embodiment the shielding structure 60 comprises a mounting mean 65 to which the lamella elements 70 are connected. Furthermore, the shielding structure 60 is connected to the basic layer, enabling the shielding structure 60 to work as a cooling structure. Heat generated in the organic light-emitting layer 15 can dissipate through the lamella elements 70. Preferably, the lamella elements 70 are either glued or welded onto the basic layer 20 or the shielding structure 60 and the basic layer 20 are one piece. In both named embodiments a direct mechanical contact between the stack of layers 15 and the shielding structure 60 is achieved, which possesses a high thermal conductivity.

The lamella elements 70 in the shown embodiment possess a triangular cross-section. In contrast to that, the lamella elements 70' also shown in FIG. 1 possess an arced cross-section. This has the advantage that the angle of reflection is steadily changing with the distance to the basic layer 20. This results in a more focused light 51 which is especially convenient in those cases where the light emitting device 10 is used as an office light, illuminating a desk.

Figure 2:
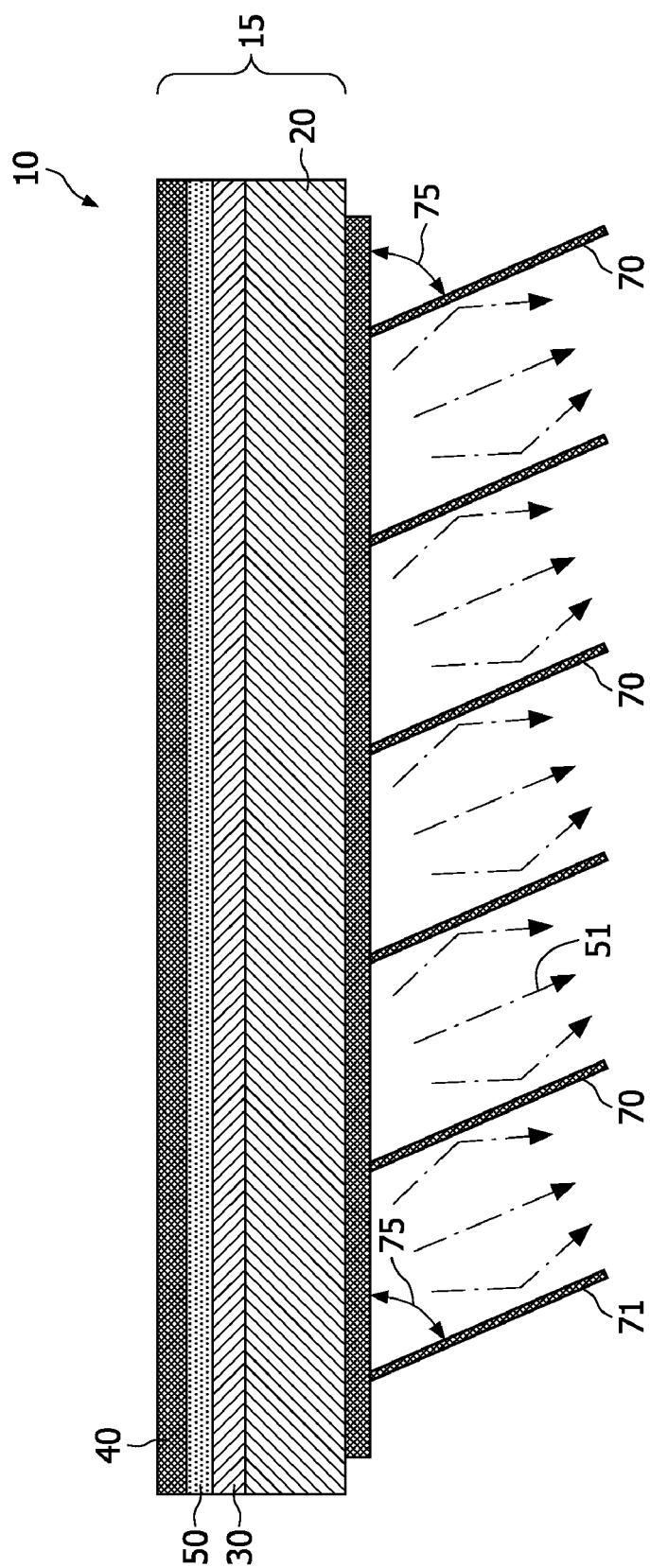
FIG. 2 shows a cross-section through a stack of layers and a plurality of lamella elements of the light emitting device.

If the light emitting device 10 is mounted underneath a ceiling but shall illuminate one of the side walls, it is advantageous that the lamella elements are arranged under a specific angle 75 with respect to the basic layer 20, as shown in FIG. 2. The inclined arrangement of the lamella elements 70 results in a sideway guiding of the artificial light 51. The angle 75 of the lamella elements 70 on the one hand depends on the position of the light emitting device and on the other hand on the position of the object to be illuminated. Therefore it might be appropriate that the angle of the lamella elements 70 covering the ceiling of a whole room may gradually change with respect to the distance to the side walls. So the lamella elements positioned within the room may possess a vertical arrangement whereas the lamella elements located near the side walls may be arranged under the angle 75. In FIG. 2 the lamella elements possess a rectangular cross-section. To obtain a more diffuse artificial light 51, the lamella elements could also possess an undulated cross-section or if a rectangular or trapezoidal cross-section is used, the surface itself could be undulated. As a result the artificial light would not be focused but scattered. The angle 75 of the lamella element may possess a value between 20° and 45° if used to gain a spot like illumination device. Angles in the range between 45° and 70° are more favorable, if the illumination device is used to illuminate large area side walls.

Figure 3:
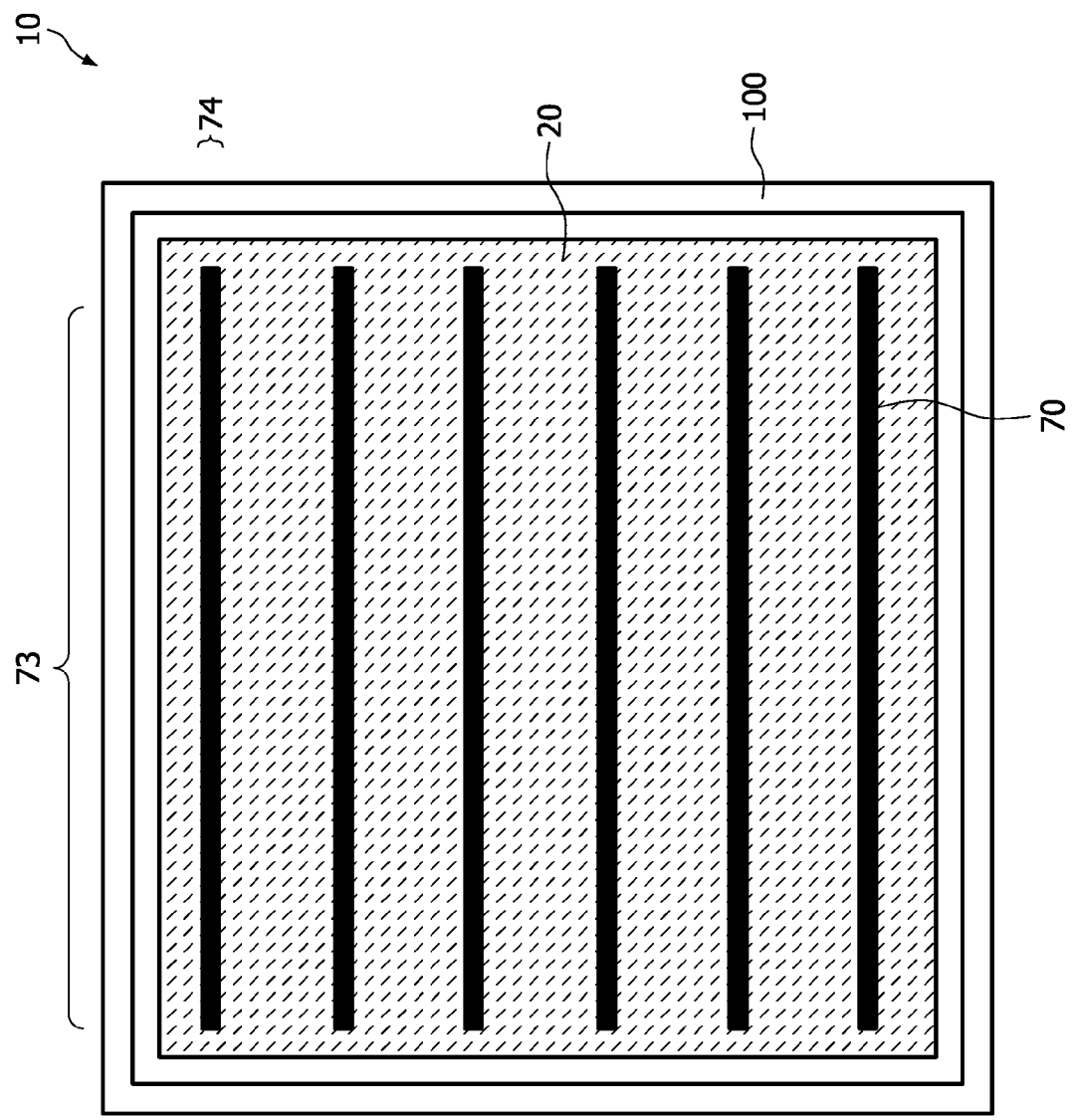
FIG. 3 shows the light emitting device with a line like shielding structure.

To prevent glare and also to achieve homogeneous heat dissipation it is advantageous that the lamella elements are arranged in a uniform manner. Such a kind of an arrangement is shown in FIG. 3. The lamella elements 70 are arranged in a line like manner possessing a length 73, which is more or less equal to the length of the basic layer 20. Today OLEDs can be produced with a size of 50×50 cm. Therefore, it is advantageous that the lamella elements 70 comprise a length between 1 cm and 100 cm, preferably between 5 cm and 50 cm. Due to their macroscopic size the lamella elements 70 cover a part of the basic layer and therefore shield the light 51 emitted by the light-emitting layer 50. Therefore, it is appropriate that the lamella elements 70 comprise a width 74 which is as narrow as possible. Measurements have shown that a width 74 between 0.5 mm and 10 mm, preferably between 1 mm and 5 mm combines the best mechanical stability with the lowest shading of the light emitting device 10. The height 72 of the lamella elements 70—as shown in FIG. 1—depends on the type of use. Different heights 72 have shown to be advantageous all lying within the interval of 0.5 mm to 50 mm. The height 72 as well as the width 74 of the lamella elements 70 corresponds with the distance between two lamella elements 70. If the height 72 is reduced more lamella elements have to be arranged on the light emitting device 10 to achieve the needed guiding of the artificial light 51 and to prevent glare.

Figure 4:
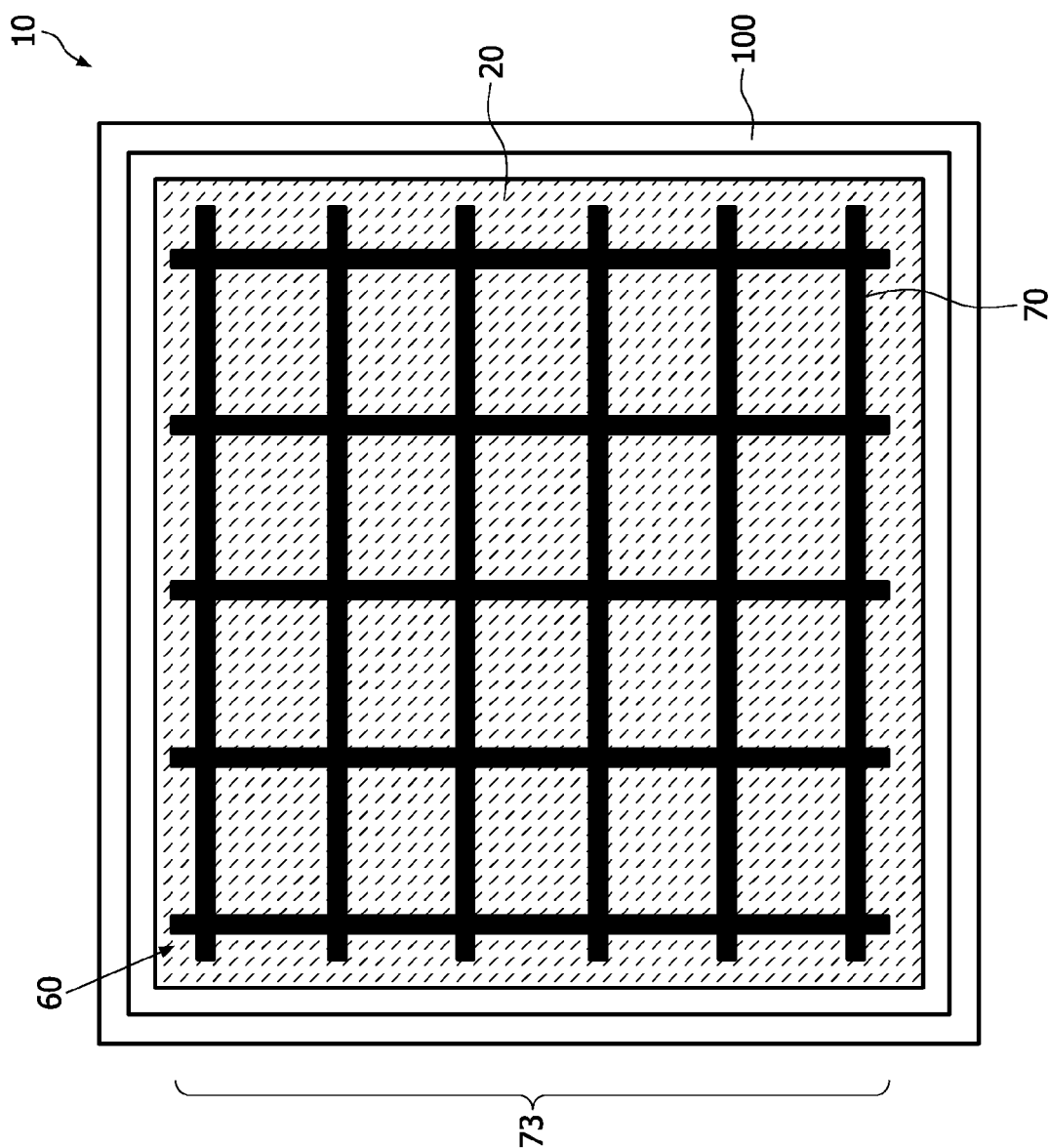
FIG. 4 shows the light emitting device with a foursquare like shielding structure and FIG. 5 shows the light emitting device with lamella elements arranged to form a honeycomb structure.

Another advantageous embodiment of the light emitting device 10 is shown in FIG. 4. The lamella elements 70 are arranged in a foursquare manner, preventing glare in all directions. The shielding structure 60 may be made of one piece or may be build by lamella elements 70, which may be clipped together. The size of the shielding structure 60 is adapted to the size of the basic layer 20. As shown, the stack of layers 15 is mounted in a frame mean 100, which is used to mount the light emitting device 10 to a ceiling or a wall. The frame mean 100 may also comprise a current and voltage source, a driver and other needed electronic to drive the light emitting device 10. Furthermore, the frame mean 100 may possess a connector which fits into a plug of another—not shown—frame mean 100, so that an array of frame means 100 respectively light emitting devices 10 may be connected with each other. Apart from the shown arrangement the lamella elements 70 could also be positioned in a triangular, pentagonal or octagonal manner. As FIG. 5 shows, also an arrangement in a hexagonal manner is possible.

Figure 5:
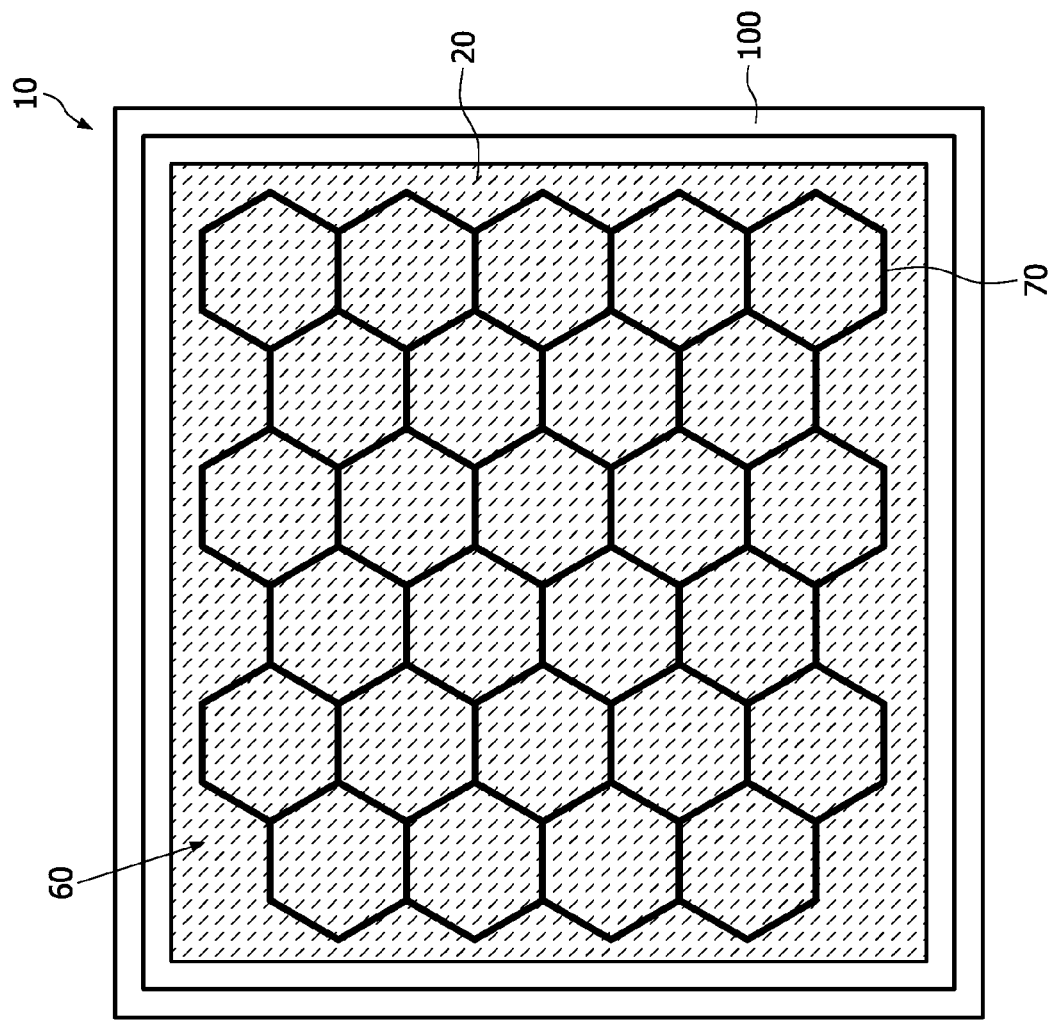

The lamella elements 70 in FIG. 5 are arranged in a hexagonal manner, so that a honeycomb structure is formed. This honeycomb structure will result in an accurate direction of the light 51 and prevent glare in all directions. Also the diameter of one honeycomb can be reduced to a barely visible size. In combination with a small height 72 and width 74 in the range of view millimeters, the achieved shielding structure 60 combines the disclosed effect of preventing glare with a barely visible structure.

LIST OF NUMERALS 10 light emitting device
15 stack of layers
20 basic layer,
30 first electrode layer
40 second electrode layer
50 organic light-emitting layer
51 artificial light
60, 60' shielding structure
65 mounting means
70, 70' lamella element
71 surfaces
72 height
73 length
74 width
75 angle
100 frame mean

The invention claimed is:

1. A light emitting device, comprising a multi-layered substrate, comprising:
    a basic layer,
    a first electrode layer,
    a second electrode layer,
    an organic light-emitting layer emitting an artificial light, the organic light-emitting layer disposed between the first and the second electrode layer,
    a shielding structure connected to and at least partially covering the basic layer, wherein the shielding structure comprises a plurality of lamella elements, the lamella elements extend from the multi-layered substrate at an angle for guiding the artificial light out of the light emitting device, wherein the angle gradually changes with distance from a side of the light emitting device so that a first lamella element near the side has a first angle and a second lamella element near a middle of the light emitting device has a second angle, the first angle being different from the second angle.

2. The light emitting device according to claim 1, wherein the shielding structure and the basic layer, form a unitary one-piece structure.

3. The light emitting device according to claim 2, wherein the shielding structure is glued and/or sputtered and/or evaporated and/or welded onto the basic layer.

4. The light emitting device according to claim 1, wherein the shielding structure comprises a frame and a connection for removably connecting the lamella elements to the frame.

5. The light emitting device according to claim 1, wherein the lamella elements possess at least one of the following cross-sections: triangular, rectangular, parallelogram, arced, undulated, polygonal or trapezoidal.

6. The light emitting device according to claim 1, wherein each lamella element has a planar or an undulated surface.

7. The light emitting device according to claim 1, wherein the lamella elements has a reflective surface.

8. The light emitting device according to claim 1, wherein the lamella elements are uniformly arranged.

9. The light emitting device according to claim 1, wherein the lamella elements are geometrically arranged on the basic layer in at least one of the following configurations: triangular, foursquare, pentagonal, or octagonal.

10. The light emitting device according to claim 1, wherein the lamella elements are arranged on the basic layer in a hexagonal manner, so that the lamella elements form a honeycomb structure.

11. The light emitting device according to claim 1, wherein each lamella element is arranged at a specific angle relative to the basic layer ranging between 20° and 70°.

12. The light emitting device according to claim 1, wherein the lamella elements comprise a material with a thermal conductivity larger than 50 W/(mK).

13. The light emitting device of claim 1, wherein the first angle is an acute angle and the second angle is a right angle.

* * * * *